(12) United States Patent
Keeth et al.

(10) Patent No.: US 6,882,579 B2
(45) Date of Patent: Apr. 19, 2005

(54) MEMORY DEVICE AND METHOD HAVING DATA PATH WITH MULTIPLE PREFETCH I/O CONFIGURATIONS

(75) Inventors: Brent Keeth, Boise, ID (US); Brian Johnson, Boise, ID (US); Troy A. Manning, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/705,388

(22) Filed: Nov. 10, 2003

(65) Prior Publication Data

US 2004/0095816 A1 May 20, 2004

Related U.S. Application Data

(60) Continuation of application No. 10/278,528, filed on Oct. 22, 2002, now Pat. No. 6,693,836, which is a division of application No. 09/814,566, filed on Mar. 21, 2001, now Pat. No. 6,515,914.

(51) Int. Cl.$^7$ .............................................. G11C 7/00
(52) U.S. Cl. .......................... 365/189.03; 365/189.08; 365/219; 365/221
(58) Field of Search ....................... 365/189.03, 189.08, 365/219, 221

(56) References Cited

U.S. PATENT DOCUMENTS

| | | | | |
|---|---|---|---|---|
| 5,046,023 A | * | 9/1991 | Katsura et al. | 345/619 |
| 5,537,555 A | * | 7/1996 | Landry et al. | 710/310 |
| 5,651,138 A | * | 7/1997 | Le et al. | 711/154 |
| 5,717,440 A | * | 2/1998 | Katsura et al. | 345/558 |
| 5,732,041 A | * | 3/1998 | Joffe | 365/230.05 |
| 5,831,924 A | * | 11/1998 | Nitta et al. | 365/230.03 |
| 5,923,899 A | | 7/1999 | Martin et al. | 710/8 |
| 5,995,442 A | | 11/1999 | Toda et al. | 365/233 |
| 5,999,458 A | | 12/1999 | Nishimura et al. | 365/189.05 |
| 6,032,274 A | | 2/2000 | Manning | 714/718 |
| 6,084,823 A | | 7/2000 | Suzuki et al. | 365/233 |
| 6,172,938 B1 | | 1/2001 | Suzuki et al. | 365/233 |
| 6,185,149 B1 | | 2/2001 | Fujioka et al. | 365/233 |
| 6,246,614 B1 | | 6/2001 | Ooishi | 365/191 |
| 6,252,804 B1 | | 6/2001 | Tomita | 365/189.05 |
| 6,400,617 B1 | | 6/2002 | Aikawa et al. | 365/200 |
| 6,493,394 B1 | * | 12/2002 | Tamura et al. | 375/257 |
| 6,515,914 B1 | * | 2/2003 | Keeth et al. | 365/189.05 |
| 6,665,223 B1 | * | 12/2003 | Keeth et al. | 365/220 |
| 6,683,814 B1 | * | 1/2004 | Keeth et al. | 365/221 |
| 6,690,609 B1 | * | 2/2004 | Keeth et al. | 365/221 |
| 6,693,836 B1 | * | 2/2004 | Keeth et al. | 365/221 |
| 6,781,590 B1 | * | 8/2004 | Katsura et al. | 345/538 |
| 2001/0019503 A1 | | 9/2001 | Ooishi | 365/191 |
| 2002/0135501 A1 | | 9/2002 | Keeth et al. | 341/100 |
| 2002/0178274 A1 | | 11/2002 | Kovacevic | 709/231 |
| 2003/0043658 A1 | | 3/2003 | Keeth et al. | 365/200 |
| 2003/0043659 A1 | | 3/2003 | Keeth et al. | 365/200 |
| 2003/0043669 A1 | | 3/2003 | Keeth et al. | 365/220 |
| 2003/0048668 A1 | | 3/2003 | Keeth et al. | 365/189.05 |

\* cited by examiner

*Primary Examiner*—Viet Q. Nguyen
(74) *Attorney, Agent, or Firm*—Dorsey & Whitney LLP

(57) ABSTRACT

A memory device is operable in either a high mode or a low speed mode. In either mode 32 bits of data from each of two memory arrays are prefetched into respective sets of 32 flip-flops. In the high-speed mode, the prefetched data bits are transferred in parallel to 4 parallel-to-serial converters, which transform the parallel data bits to a burst of 8 serial data bits and apply the burst to a respective one of 4 data bus terminals. In the low speed mode, two sets of prefetched data bits are transferred in parallel to 8 parallel-to-serial converters, which transform the parallel data bits to a burst of 8 serial data bits and apply the burst to a respective one of 8 data bus terminals.

16 Claims, 5 Drawing Sheets

US 6,882,579 B2

MEMORY DEVICE AND METHOD HAVING DATA PATH WITH MULTIPLE PREFETCH I/O CONFIGURATIONS

CROSS-REFERENCE TO RELATED APPLICATION

This application is a continuation of U.S. patent application Ser. No. 10/278,528, filed Oct. 22, 2002 now U.S. Pat. No. 6,693,836, which is a divisional of U.S. patent application Ser. No. 09/814,566, filed Mar. 21, 2001, issuing as U.S. Pat. No. 6,515,914 on Feb. 4, 2003.

TECHNICAL FIELD

This invention relates to memory devices, and more particularly to a memory device data path and method that can operate in either a high-speed, narrow data bus mode or a low-speed, wide data bus mode.

BACKGROUND OF THE INVENTION

Memory devices, such as dynamic random access memories ("DRAMs"), have a variety of performance parameters. One of the most important of these performance parameters is the speed at which memory devices are able to read and write data. Generally, memory devices capable of reading and writing data at a higher speed, known as high performance memory devices, are more expensive. Conversely, memory devices that are only capable of accessing data at a slower rate, known as low performance memory devices, must be sold at a cheaper price. In an attempt to increase the operating speed of memory devices, double data ("DDR") rate DRAMs have been developed. DDR DRAMs are synchronous DRAMs that perform two memory operations each clock cycle-one on each transition of each clock pulse. In a typical DDR DRAM, the memory cells in two adjacent columns having the same column address are read each clock cycle.

Another performance parameter applicable to memory devices is the width of the memory device's data bus. Wider data buses operating at a given speed have a higher bandwidth, i.e., a greater number of bits/second can be accessed. The data bus of most memory devices, such as DRAMs, generally have a width of various powers of 2, ie., 4, 8, 16, etc. bits.

The need to provide memory devices having different performance parameters generally requires memory device manufacturers to design and manufacture a wide variety of memory devices. For example, memory device manufacturers must design and fabricate relatively expensive memory devices that are capable of operating at a high-speed and different, relatively inexpensive memory devices that are only capable of operating at a relatively low-speed. Unfortunately, it is expensive to design each memory device and the processing needed to fabricate the memory device. The expense of designing and fabricating a variety of different memory devices having different performance parameters is exacerbated by the rapid obsolescence of memory devices as newer devices are introduced at an ever faster rate.

There is therefore a need for memory devices, such as DRAMs, that are capable of operating as either high-speed, narrow data bus memory devices or a low-speed, wide data bus memory devices.

SUMMARY OF THE INVENTION

Data are coupled from a memory array to data bus terminals by transferring 2N bits of parallel data from the array in a first mode and N bits of parallel data in a second mode. The parallel data are transferred from the array to parallel-to-serial converters using a bus having a width of N bits. The parallel-to-serial converters convert the parallel data bits to respective bursts of serial data containing N/M bits and apply the bursts to 2M data bus terminals in the first mode and M data bus terminals in the second mode. The data may be transferred from the memory array in the first operating mode by transferring first and second sets of N data bits from the array in respective first and second read operations. Alternatively, 2N data bits may be transferred from the memory array in a single read operation. As a result, data may be transferred to M data bus terminals at a relatively high-speed in a high performance mode, or to 2M data bus terminals at a relatively low-speed in a low performance mode.

DETAILED DESCRIPTION OF THE INVENTION

Figure 1:
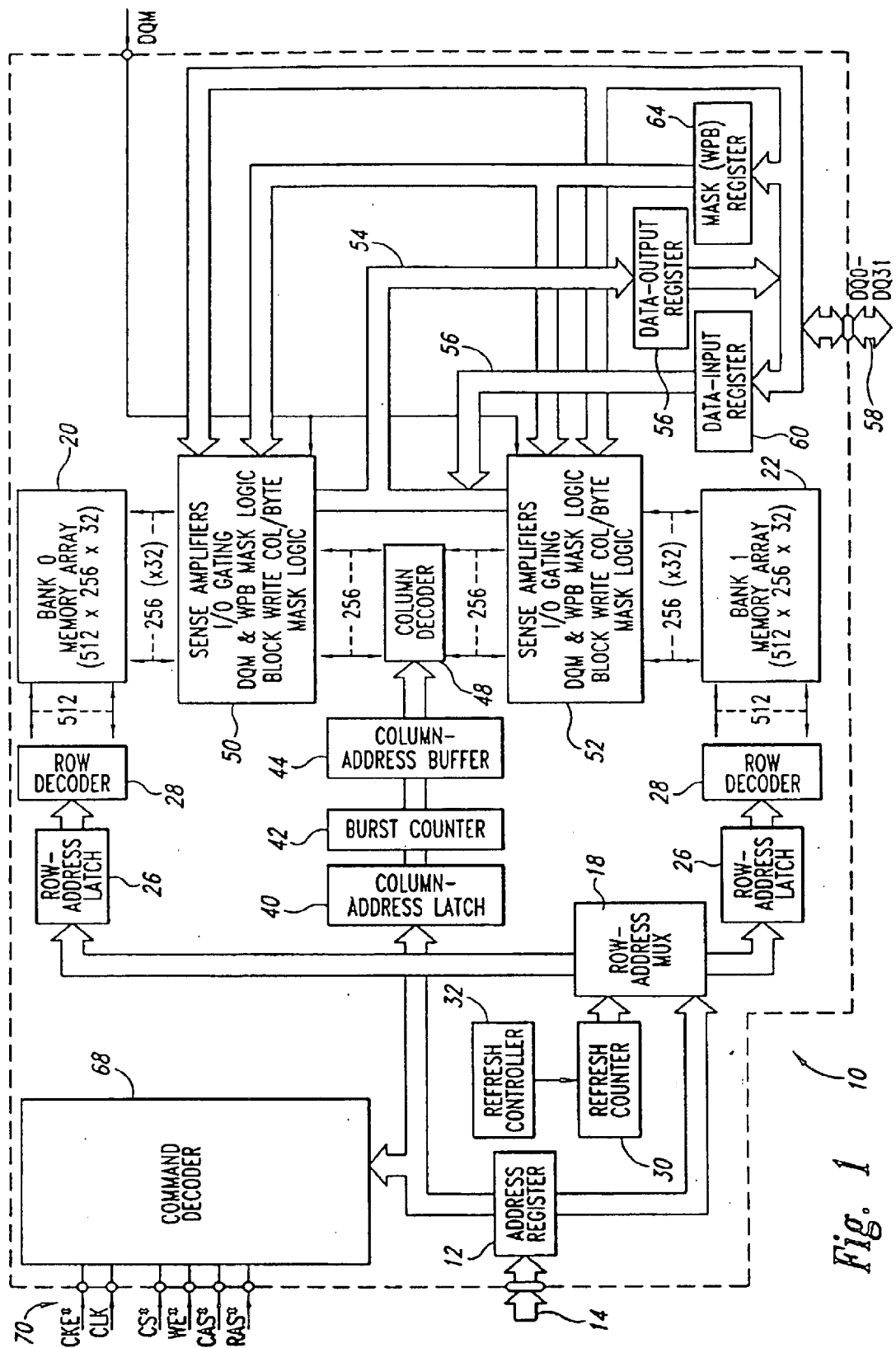
FIG. 1 is a block diagram of a memory device in accordance with one embodiment of the invention.

A memory device in accordance with one embodiment of the invention is illustrated in FIG. 1. The memory device illustrated therein is a synchronous dynamic random access memory ("SDRAM") 10, although the invention can be embodied in other types of DRAMs, such as packetized DRAMs and RAMBUS DRAMs (RDRAMS"), as well as other types of memory devices, such as static random access memories ("SRAMs"). The SDRAM 10 includes an address register 12 that receives either a row address or a column address on an address bus 14. The address bus 14 is generally coupled to a memory controller (not shown in FIG. 1). Typically, a row address is initially received by the address register 12 and applied to a row address multiplexer 18. The row address multiplexer 18 couples the row address to a number of components associated with either of two memory banks 20, 22 depending upon the state of a bank address bit forming part of the row address. Associated with each of the memory banks 20, 22 is a respective row address latch 26 which stores the row address, and a row decoder 28 which applies various signals to its respective array 20 or 22 as a function of the stored row address. The row address multiplexer 18 also couples row addresses to the row address latches 26 for the purpose of refreshing the memory cells in the arrays 20, 22. The row addresses are generated for refresh purposes by a refresh counter 30, which is controlled by a refresh controller 32.

After the row address has been applied to the address register 12 and stored in one of the row address latches 26, a column address is applied to the address register 12. The address register 12 couples the column address to a column address latch 40. Depending on the operating mode of the SDRAM 10, the column address is either coupled through a burst counter 42 to a column address buffer 44, or to the burst counter 42 which applies a sequence of column addresses to the column address buffer 44 starting at the column address output by the address register 12. In either case, the column address buffer 44 applies a column address to a column decoder 48 which applies various signals to respective sense amplifiers and associated column circuitry 50, 52 for the respective arrays 20, 22.

Data to be read from one of the arrays 20, 22 is coupled to the column circuitry 50, 52 for one of the arrays 20, 22, respectively. The data is then coupled through a read data path 54 to a data output register 56, which applies the data to a data bus 58. Data to be written to one of the arrays 20, 22 is coupled from the data bus 58 through a data input register 60 and a write data path 62 to the column circuitry 50, 52 where it is transferred to one of the arrays 20, 22, respectively. A mask register 64 may be used to selectively alter the flow of data into and out of the column circuitry 50, 52, such as by selectively masking data to be read from the arrays 20, 22.

The above-described operation of the SDRAM 10 is controlled by a command decoder 68 responsive to command signals received on a control bus 70. These high level command signals, which are typically generated by a memory controller (not shown in FIG. 1), are a clock enable signal CKE*, a clock signal CLK, a chip select signal CS*, a write enable signal WE*, a row address strobe signal RAS*, and a column address strobe signal CAS*, which the " " designating the signal as active low. Various combinations of these signals are registered as respective commands, such as a read command or a write command. The command decoder 68 generates a sequence of control signals responsive to the command signals to carry out the function (e.g., a read or a write) designated by each of the command signals. These command signals, and the manner in which they accomplish their respective functions, are conventional. Therefore, in the interest of brevity, a further explanation of these control signals will be omitted.

The read data path 54 from the column circuitry 50, 52 to the data output register 56 includes one or more pairs of complimentary input/output ("I/O") lines (not shown in FIG. 1) that couple data from a sense amplifier (not shown) for each column in each array 20, 22, respectively. The sense amplifier in the column circuitry 50, 52 for an addressed column receives complimentary signals from a pair of complimentary digit lines. The digit lines are, in turn, coupled to a pair of the complimentary I/O lines by column addressing circuitry. Each pair of I/O lines is selectively coupled by a pair of complimentary data lines to the complimentary inputs of a DC sense amplifier (not shown) included in the read data path 54. The DC sense amplifier, in turn, outputs data to the data output register 56, which is coupled to output or "DQ" terminals of the memory device 10. As explained in detail below, the SDRAM 10 according to one embodiment of the invention includes 16 DQ terminals, 8 of which are used in the high-speed mode and 16 of which are used in the low speed mode. Each of the DQ terminals coupled serial data to or from the DRAM 10 in bursts of 8 bits.

Figure 2:
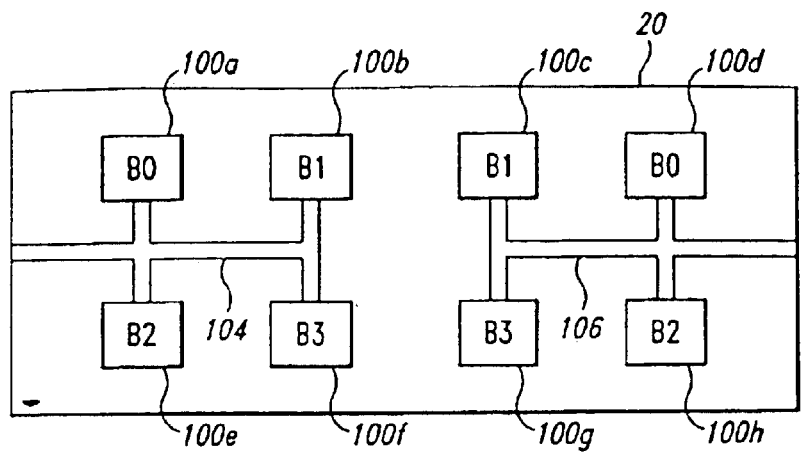
FIG. 2 is a block diagram of a memory array used in the memory device of FIG. 1.

One of the memory arrays 20 is illustrated in FIG. 2. The memory array 20 includes 8 memory array "mats" 100a–h divided into 4 banks, which are labeled in FIG. 2 at B0–B3. However, it will be understood that the memory array mats 100a–h may be arranged in a greater or lesser number of banks, and the memory array 20 may contain a greater or lesser number of memory array mats 100. The read data path 54 FIG. 1) includes a first I/O bus 104 having 32 pairs of complimentary I/O lines coupled to the memory array mats 100a,b,e,f, and a second I/O bus 106 having 32 pairs of complimentary I/O lines coupled to the memory array mats 100c,d,g,h.

Figure 3:
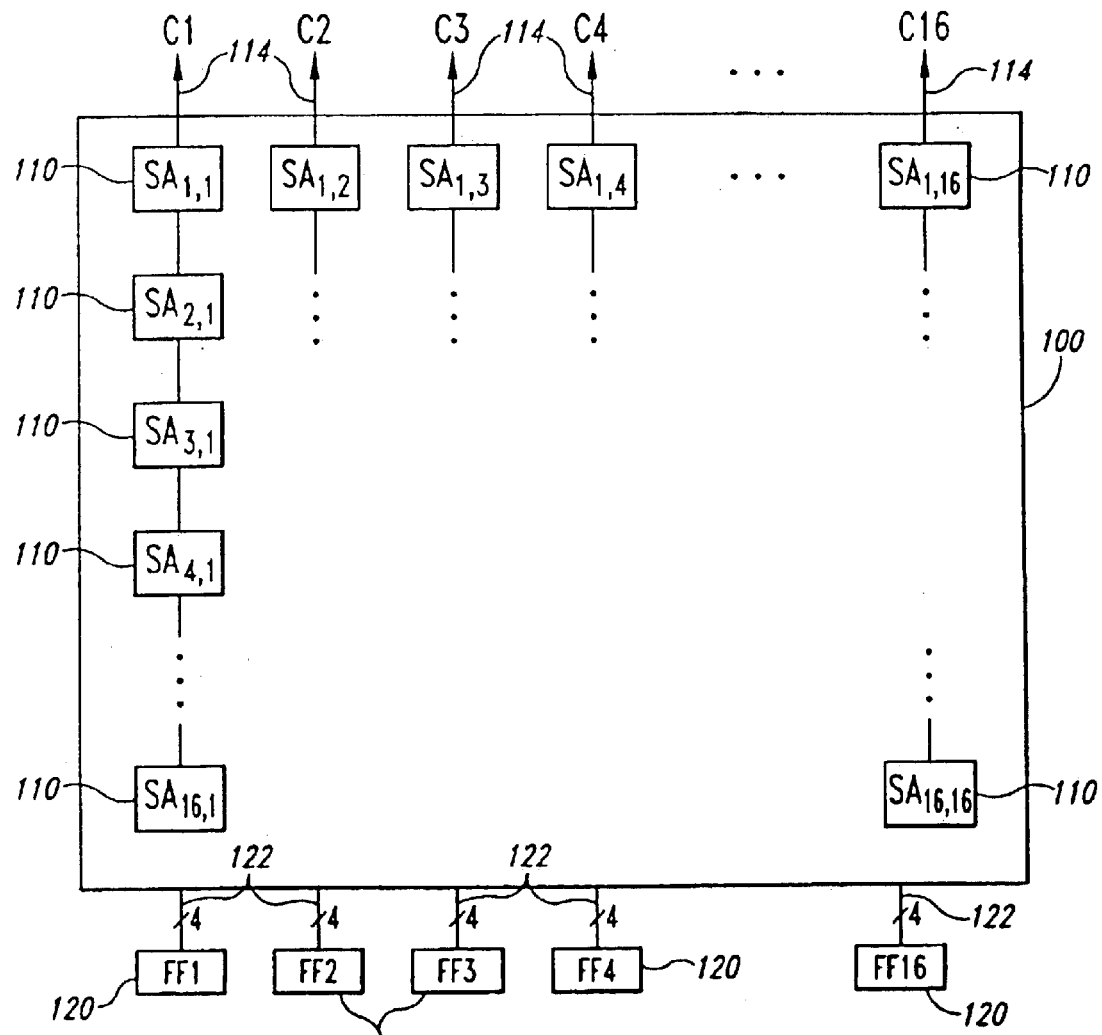
FIG. 3 is a block diagram of one of several memory array mats used in the memory array of FIG. 2.

One of the memory array mats 100 used in the memory array 20 according to one embodiment of the invention is illustrated in FIG. 3. The mat 100 includes 256 sub-arrays 110 arranged in 16 columns and 16 rows. Each of the memory mats 100 includes 16 column lines 114, each of which, when activated, selects the corresponding column. The memory mat 100 also includes a large number of row lines (not shown), which, when activated, selects a respective row in the sub-arrays 110. A set of 4 flip-flops 120 is positioned beneath each column of the memory mat 100. When a row line is activated, 4 bits of data are coupled from the memory mat 100 from each column selected by activating a respective column line 114. The 4 bits of data for each column are coupled from the memory mat 100 to a respective set of flip flops 120 through a respective digit line bus 122 that includes 4 complimentary digit lines. Thus, when 8 column lines 114 are activated, 32 bits of data are stored in 8 sets of flip-flops corresponding to the respective activated column lines 114.

Figure 4:
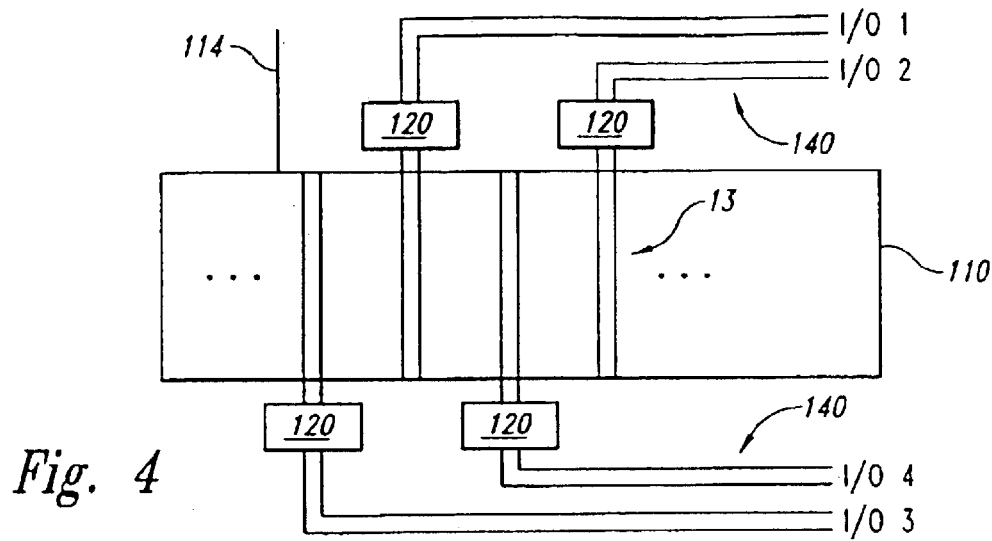
FIG. 4 is a block diagram of one of several memory sub-arrays used in the memory array mat of FIG. 3.

As shown in FIG. 4, each of the sub-arrays 110 includes 256 k memory cells (not shown) arranged in rows and columns. When a row of the memory mat 100 is activated and a column line 114 is selected, 4 complimentary digit lines 130 in 4 respective columns of the sub-array 110 are coupled to 4 respective flip-flops 120. The flip-flops 120, in turn, drive respective complimentary pairs of I/O lines 140. In operation, 8 columns of each memory mat 100 are activated at a time, so that the 8 sub-arrays 110 in 8 respective active columns each output 4 bits of data. Each memory array mat 100 thus provides 32 bits of data, which are temporarily stored in the flip-flops 120. Since two memory array mats 100 are used for each bank, each bank B0–B3 outputs 64 bits of data. In operation, the 4 data bits coupled from each sub-array 110 are prefetched and stored in the flip-flops 120 for subsequent coupling to the DQ terminals (FIG. 1), as explained in greater detail below.

The data bits are transferred from the flip-flops 120 in either of two modes, depending on whether the memory device 10 is operating in either the high-speed mode or the low-speed mode. In the high-speed mode, 8 bits of data stored in respective flip-flops 120 are transferred serially to a respective data bus (DQ) terminal. The manner in which the parallel data stored in the flip-flips 120 are converted to serial data will be explained with reference to FIGS. 5 and 6. Since there are 32 bits stored in respective flip-flops 120 for each memory array mat 100, the 32 bits are coupled in serial bursts of 8 bits to each of 4 data bus terminals in the high-speed mode. The 32 bits stored in the flip-flops 120 for the other memory array mat 100 are also coupled in serial bursts of 8 bits to each of 4 data bus terminals. As a result, in the high-speed mode, 64 bits are coupled in serial bursts of 8 bits to each of 8 data bus terminals.

In the low-speed mode, the data bits stored in the flip-flops 120 are also transferred serially to a respective data bus (DQ) terminal. However, in the low-speed mode, the data bits are transferred to 16 data bus terminals. Yet circuitry (not shown) interfacing with the memory device 10 is adapted to receive data in bursts of 8 bits from each of the 16 data bus terminals. Thus, in the low-speed mode, 128 bits are required to couple bursts of 8 bits to each of 16 data bus terminals. Since there are 32 bits stored in each set of respective flip-flops 120 for each memory array mat 100, the 64 bits stored in the flip-flops 120 for both memory array mats 100 can supply only half of the required number of data bits. As a result, in the low-speed mode, two sets of 64 bits must be prefetched and stored in the flip-flops 120 before the prefetched data bits can be coupled to the data bus terminals. The reason this operating mode is considered a low-speed mode is because of the extra time needed to prefetch and/or coupled twice as many data bits from each memory array mat 100 in the low-speed mode compared to the high-speed mode. Therefore, to prefetch 64 bits from each memory array mat 100, the memory device must perform 2 read operations with each data transfer, which requires substantially more time than a single read operation. However, the bandwidth of the memory device 10 is somewhat the same in both modes. In the high-speed mode, twice as many memory devices 10 are needed to provide data to the 16 data bus terminals compared to the low speed mode, but the data is provided twice as fast.

To help maintain the operating speed of the memory device in the low-speed mode, the memory device 10 may, instead of performing two read operations to provide 128 bits of data, simultaneously activate all 16 columns in each memory array mat 110. Thus, each memory array mat 110 prefetches 64 bits (4 bits from each column) during each read operation. As a result, all 64 of the flip-flops 120 shown in FIG. 3 are needed for each memory array mat 110 to store the 64 prefetched bits.

In operation, 4 data bits prefetched from each column and stored in respective flip-flops 120 are coupled through a respective pair of I/O lines 140 during the first part of each read cycle, and 4 data bits prefetched from another column and stored in respective flip-flops 120 are coupled through the same pair of I/O lines 140 during the second part of each read cycle. Thus, in this alternative low-speed mode, 128 bits of data stored in respective flip-flops 120 for both memory array mats 110 are coupled through 64 pairs of complimentary I/O lines for each read operation. In contrast, in the high-speed mode described above, 64 bits of data stored in respective flip-flops 120 for both memory array mats 110 are coupled through 64 pairs of complimentary I/O lines. As a result, in the low-speed mode, twice as many data bits must be coupled through the data lines during the same period of time. It is for this reason, that this operating mode is considered a low-speed mode even though it does not require 2 read operations for every read cycle.

Figure 5:
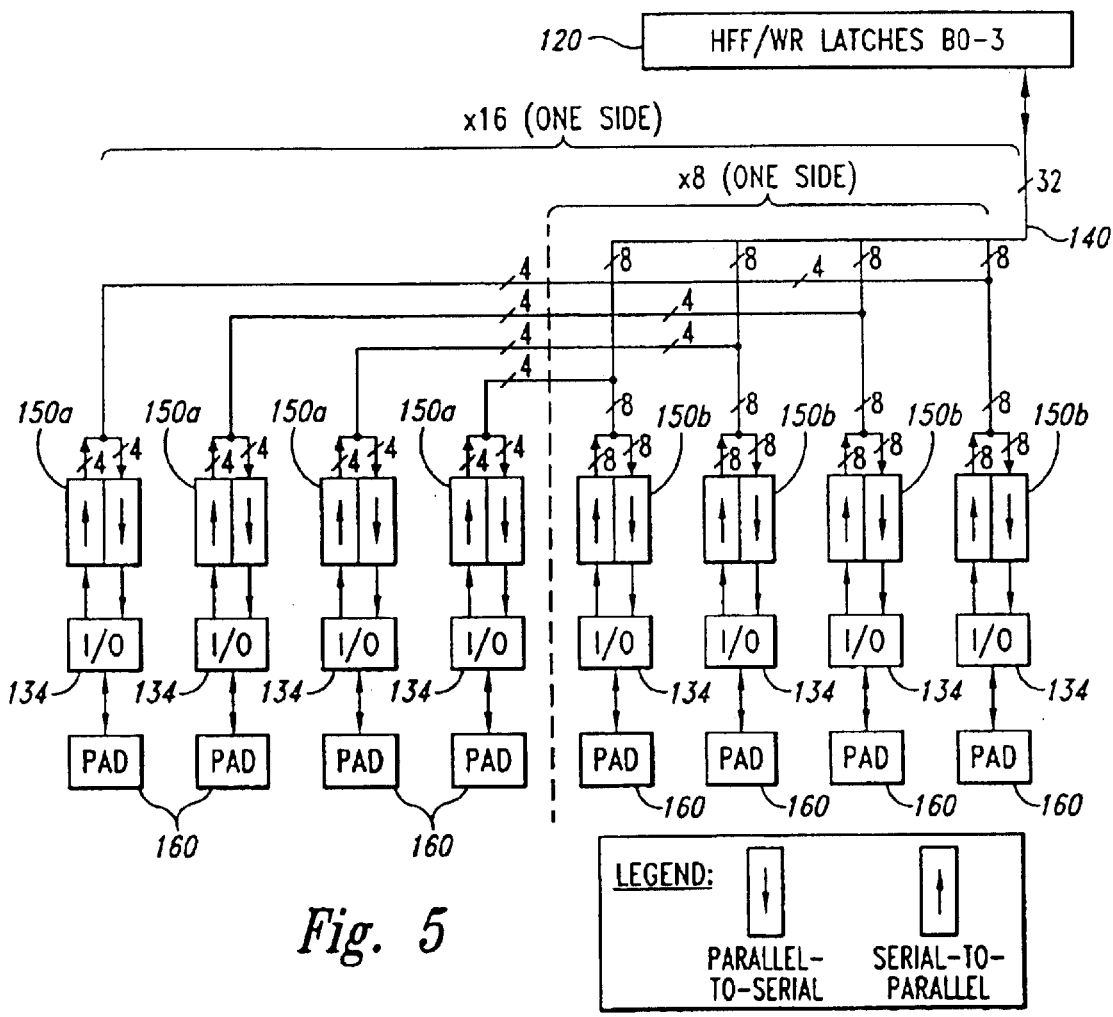
FIG. 5 is a block diagram of a portion of a data path used in the memory device of FIG. 1.

The manner in which prefetched data bits are coupled between the flip-flops 120 and data bus terminals for one of the memory mats 100 is shown in FIG. 5. The circuitry shown in FIG. 5 is adapted to be used with the first embodiment of the low-speed operating mode in which two reads are performed for every read operation. However, it will be understood that the circuitry can be easily modified for the alternative embodiment in which every column of each memory array mat 100 is read and twice as many flip-flops 120 are provided.

With reference to FIG. 5, the prefetched 32 data bits stored in the respective flip-flops 120 are coupled through 32 respective complimentary pairs of I/O lines 140. Eight groups of 4 I/O line pairs 140 are coupled to 8 respective parallel-to-serial converters 150 so that 4 pairs of I/O lines 140 are coupled to each converter 150. However, 4 of the converters 150a include only 4 pairs of input lines, which are coupled to 4 pairs of I/O lines 140 of a respective group. The remaining 4 converters 150b include 8 input lines, which are coupled to 4 pairs of I/O lines 140 of a respective group and 4 pairs of I/O lines 140 that are coupled to one of the 4-input converters 150a.

In the low-speed mode, 4 bits of parallel data are coupled to each of the 16 converters 150a,b for each read operation, so that, after two read operations have been performed, 8 bits have been coupled to each of the 16 parallel-to-serial converters 150. The converters 150 then each output an 8-bit burst through respective I/O paths 134 to 16 respective data bus terminals 160. In the high-speed mode, 8 bits of parallel data are coupled to each of the four 8-input converters 150b, and the converters 150b then each output an 8-bit burst through I/O paths 134 to 8 respective data bus terminals 160. Thus, in the high-speed mode the four 4-input converters 150a and the data bus terminals 160 to which they are coupled are not used.

For a write operation, burst of 8 bits are applied to each of either 8 or 16 data bus terminals, depending upon whether the SDRAM 10 is operating in either the high-speed mode or the low-speed mode, respectively. Respective serial-to-parallel converters 168 then convert the 8-bit burst to either an 8 bits of parallel data (in the high-speed mode) or two sets of 4 bits of parallel data (in the low-speed mode). The 4 data bits applied to each column of the memory mat are then coupled to respective columns of each sub-array 110 in a write operation.

Figure 6:
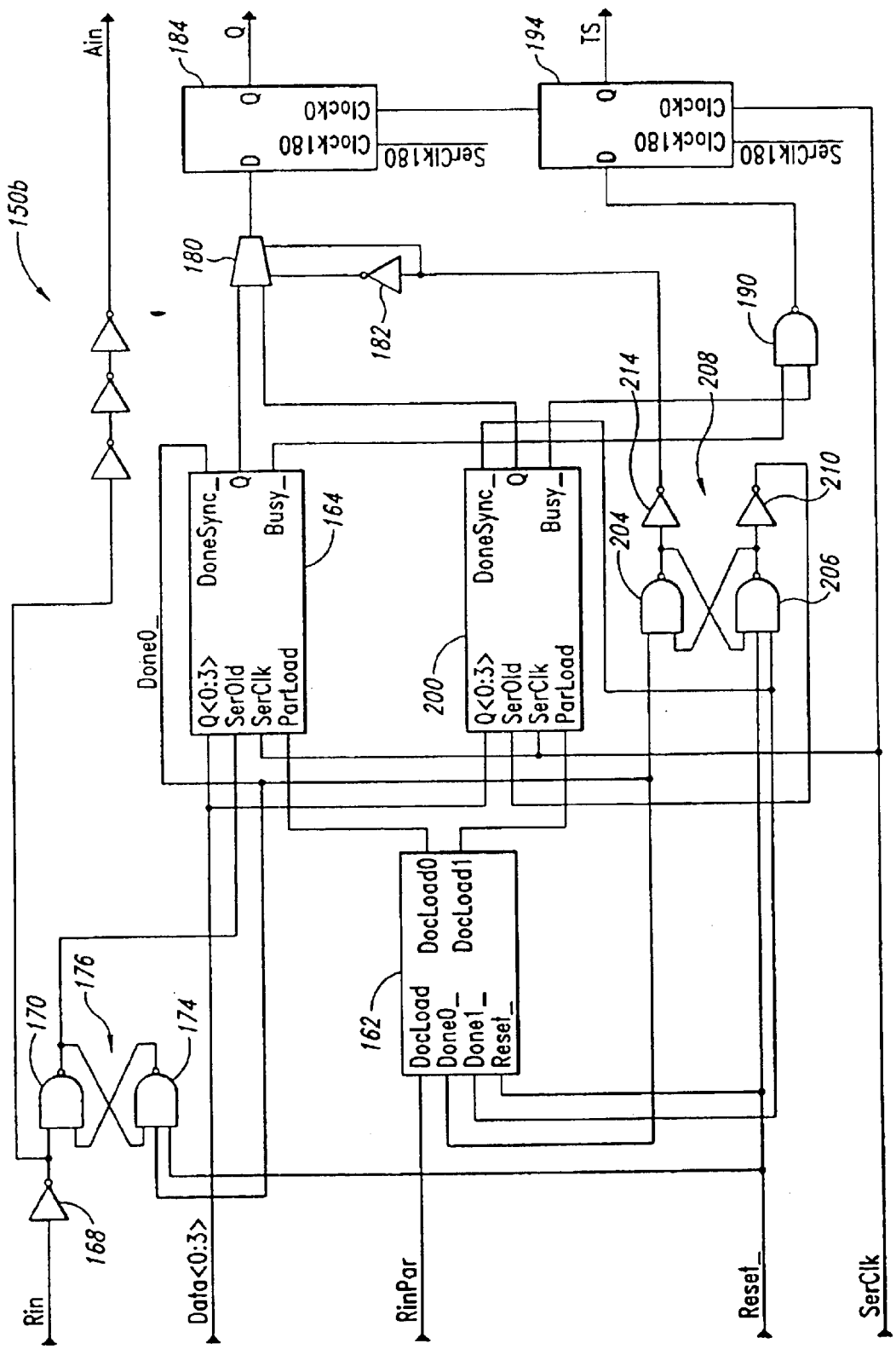
FIG. 6 is a logic and block diagram of one of several parallel-to-serial converters used in the portion of a data path shown in FIG. 5.

One embodiment of the 8-bit parallel-to-serial converters 150a is shown in FIG. 6. As previously explained, the parallel-to-serial converter 150a is adapted to receive 8 bits of parallel data and output a burst of 8 serial bits. However, the 4-bit parallel-to-serial converters 150b are substantially identical, as explained further below. When parallel data are to be transferred from the flip-flops 120 to the converter 150a RinPar signal transitions high, thereby triggering a load logic circuit 162. The load logic circuit 162 then outputs a high Data Load 0 ("DatLoad0") output, which is applied to a 4 input latch 164. The latch 164 has a 4-bit parallel data input that is selectively coupled to 8 of the flip-flops 120. Thus, each data input of the parallel-to-serial converter 150a is coupled to the outputs of two flip-flops 120. The outputs of 4 of the flip-flops 120 are coupled to respective data input terminals on the low-to-high transition of the RinPar signal. The 4 bits of parallel data are then stored in the latch 164.

When the 4 bits of data stored in the latch 164 are to be shifted out of the latch, an Rin signal transitions high, thereby causing an inverter 168 to output a low to a NAND gate 170, which, with NAND gate 174, forms a set-reset flip-flop 176. The flip-flop 176 is then set, thereby causing the NAND gate 170 to output an active high Serial Unload ("SerUld") signal to the latch 164. The high SerUld signal causes the latch 164 to output an active low Busy signal, and, in response to a Serial Clock ("SerClk") signal shift the 4 bits of stored data out of the latch one bit at a time on each SerClk transition.

The serial data at the output of the latch 164 is applied to a multiplexer 180. As explained further below, the output of an inverter 182 is initially low and the other input to the multiplexer 180 is initially high. As a result, the multiplexer 180 couples a 4-bit burst of serial data from the latch 164 to a double-edge triggered flip-flop 184 that is clocked by the SerClk signal and its compliment. Thus, on a transition of the SerClk signal having one polarity, each bit of data is shifted into the double-edge triggered flip-flop 184, and that bit of data is then shifted out of the flip-flop 184 on the next transition of the SerClk signal having the opposite polarity.

The high Busy signal at the output of the latch 164 causes a NAND gate 190 to output a high to a clocked driver 194 that is identical to the double-edge triggered flip-flop 184. Thus, on each transition of the SerClk signal, the driver 194 outputs a high Tri-State ("TS") signal. The TS signal is used to switch circuitry (not shown) receiving the serial data from the flip-flop 184 downstream in the read data path 54 (FIG. 1) from a tri-state (high impedance) to an active, low impedance state.

Prior to the end of 4 cycles of the SerCLk, a second set of 4 flip-flops 120 are coupled to respective Data<0:3> terminals and the Rin signal transitions low. The high-to-low transition of the Rin signal causes the load logic circuit 162 to output a high Data Load 1 ("DatLoad1") output, thereby causing a second 4-input latch 200 to store the 4 bits of parallel data from the flip-flops 120.

When the 4 bits of data stored in the latch 164 have been shifted out responsive to 2 periods of the SClk signal, the latch 164 outputs a low DoneSync signal. The low DoneSync signal is applied to the NAND gate 174 to reset the flip-flop 176, thereby causing the NAND gate 170 to disable the latch 164 from further outputting further serial data. The low DoneSync signal is also applied to a Done0 input of the load logic circuit 162 to subsequently allow the counter to be reset, as explained further below. Finally, the Done0 signal is applied to a NAND gate 204 that, with a NAND gate 206, forms a flip-flop 208 that is set by the Done0 signal. When the flip-flop 208 is set, it causes the NAND gate 206 to output a high, which causes an inverter 210 to apply an active high signal to a Serial Unload ("SerUld") terminal of the latch 200. The latch 200 then applies the 4 stored bits to the multiplexer 180 responsive to the SerClk signal, as explained above for the latch 164. The active high signal applied to the SerUld terminal of the latch 200 also causes the latch 164 to apply an active low Busy signal to the NAND gate 190. The NAND gate 190 then applies a high to the driver 194 to cause the NAND gate 190 to output a high TS signal, as previously explained.

Setting the flip-flop 208 also causes the NAND gate 204 to output a low, which causes an inverter 214 to apply a high to the inverter 182 and the multiplexer 180. The multiplexer 180 then couples the output of the latch 200 to the double-edge triggered flip-flop 184.

When the 4 bits of data stored in the latch 200 have been shifted out of the latch 200, the latch 200 outputs a low DoneSync signal. The low DoneSync signal is applied to the NAND gate 200 to reset the flip-flop 208, thereby disabling the latch 200 from further outputting serial data. The low DoneSync signal is also applied to a Done1 input of the load logic circuit 162 to reset the load logic circuit 162 in preparation for a subsequent transition of the RinPar signal.

The flip-flops 176, 208 and the load logic circuit 162 can also be reset by an active low Reset signal, which is typically generated upon power-up.

As previously mentioned, the parallel-to-serial converter 150a converts 2 loads of 4 parallel bits of data to a burst of 8 serial bits of data. The parallel-to-serial converter 150a can easily be modified to implement the converter 150b that converts 4 either 4 or 8 parallel bits of data to a burst of 8 serial bits of data. For example, the converter 150b can be implemented by simply adding a set of 4 latches (not shown) to latch the parallel load of 8 bits. These latches are disabled when in the 4-bit mode and the converter 150b operates in the same manner as the converter 150a as described above.

Figure 7:
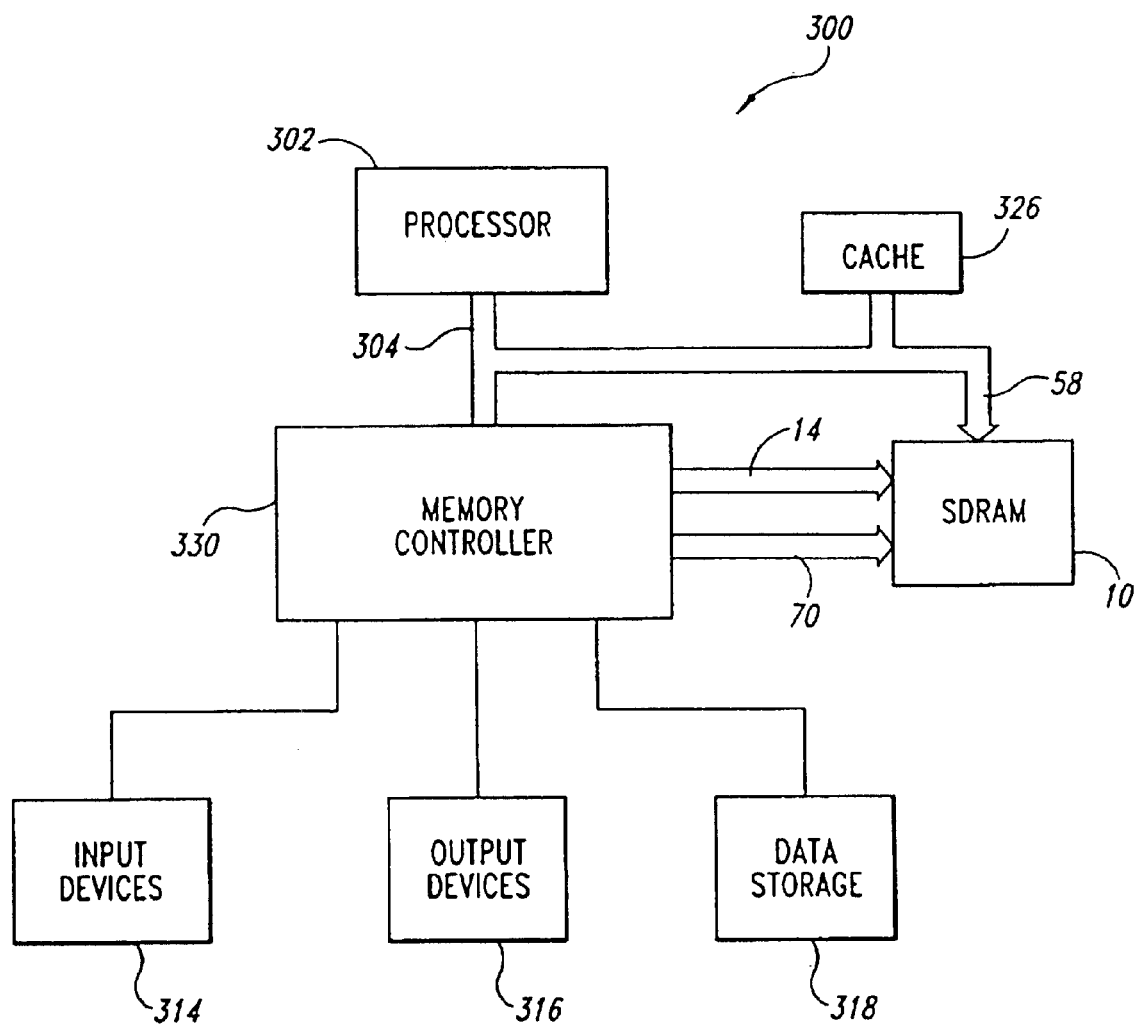
FIG. 7 is a block diagram of a computer system using the memory device of FIG. 1.

FIG. 7 shows a computer system 300 containing the SDRAM 10 of FIG. 1. The computer system 300 includes a processor 302 for performing various computing functions, such as executing specific software to perform specific calculations or tasks. The processor 302 includes a processor bus 304 that normally includes an address bus, a control bus, and a data bus. In addition, the computer system 300 includes one or more input devices 314, such as a keyboard or a mouse, coupled to the processor 302 to allow an operator to interface with the computer system 300. Typically, the computer system 300 also includes one or more output devices 316 coupled to the processor 302, such output devices typically being a printer or a video terminal. One or more data storage devices 318 are also typically coupled to the processor 302 to allow the processor 302 to store data in or retrieve data from internal or external storage media (not shown). Examples of typical storage devices 318 include hard and floppy disks, tape cassettes, and compact disk read-only memories (CD-ROMs). The processor 302 is also typically coupled to cache memory 326, which is usually static random access memory ("SRAM"), and to the SDRAM 10 through a memory controller 330. The memory controller 330 normally includes a control bus 336 and an address bus 338 that are coupled to the SDRAM 10. A data bus 340 is coupled from the SDRAM 10 to the processor bus 304 either directly (as shown), through the memory controller 330, or by some other means.

From the foregoing it will be appreciated that, although specific embodiments of the invention have been described herein for purposes of illustration, various modifications may be made without deviating from the spirit and scope of the invention. For example, although the SDRAM 10 has 16 data bus terminals, 16 DQ terminals, 8 of which are used in the high-speed mode and 16 of which are used in the low speed mode, it will be understood that memory devices may have a lesser or greater number of DQ terminals. Also, each burst of data may contain a lesser or greater number of bits than the 8-bit bursts described herein, and the width of the I/O path coupling data between the memory array and the parallel-to-serial converters may be wider or narrower than the I/O path described herein. Other variations will also be apparent to one skilled in the art. Accordingly, the invention is not limited except as by the appended claims.

What is claimed is:

1. A method of transferring data to or from a memory device in either a first operating mode or a second operating mode, the method comprising:
   in the first operating mode, transferring data to or from 2N data bus terminals of the memory device in form of a burst of M bits of data to or from each terminal; and
   in the second operating mode, transferring data to or from N data bus terminals of the memory device in form of a burst of M bits of data to or from each terminal.

2. The method of claim 1 wherein the acts of transferring data to or from the data bus terminals comprise transferring data from the data bus terminals in a data read operation.

3. The method of claim 2 wherein the act of transferring data to or from 2N terminals of the memory device in form of a burst of M bits of data to or from each terminal comprises:
   transferring a first set of M*N data bits from a memory array in a first read operation;
   storing the read M*N data bits;
   transferring a second set of M*N data bits from the memory array in a second read operation; and
   sequentially transferring M bits of the stored M*N data bits and the M data bits in the second set of M*N data bits from each of the 2N data bus terminals.

4. The method of claim 3 wherein the acts of transferring a first set of M*N data bits from a memory array in a first read operation and transferring a second set of M*N data bits from the memory array in a second read operation comprise transferring M*N bits from the memory array in parallel in each of the first and second read operations.

5. The method of claim 2 wherein the act of transferring data to or from N data bus terminals of the memory device in form of a burst of M bits of data to or from each terminal comprises:

transferring a M*N data bits from a memory array in a read operation;

sequentially transferring M bits from each of the N data bus terminals.

6. The method of claim 5 wherein the act of transferring M*N data bits from a memory array in a read operation comprises transferring M*N bits from the memory array in parallel during the read operation.

7. The method of claim 2 wherein the act of transferring data to or from 2N data bus terminals of the memory device in form of a burst of M bits of data to or from each terminal comprises:

transferring a first set of M/2 parallel data bits from a memory array for each of the 2N data bus terminals;

transferring a second set of M/2 parallel data bits from the memory array for each of the 2N data bus terminals;

converting the transferred first and second sets of M/2 parallel data bits to M serial data bits for each of the 2N data bus terminals; and coupling the M serial data bits from each of the 2N data bus terminals.

8. The method of claim 2 wherein the act of transferring data to or from N data bus terminals of the memory device in form of a burst of M bits of data to or from each terminal comprises:

transferring M parallel data bits from a memory array for each of the N data bus terminals;

converting the transferred M parallel data bits to M serial data bits for each of the N data bus terminals; and coupling each of the M serial data bits from each of the N data bus terminals.

9. The method of claim 1 wherein N is equal to 8 and M is equal to 8.

10. The method of claim 1 wherein the acts of transferring data to or from the data bus terminals comprise transferring data to the data bus terminals in a data write operation.

11. The method of claim 10 wherein the act of transferring data to or from 2N data bus terminals of the memory device in form of a burst of M bits of data to or from each terminal comprises:

sequentially transferring M bits of data to each of the 2N data bus terminals;

transferring a first set of M*N data bits to a memory array in a first write operation;

transferring a second set of M*N data bits to the memory array in a second write operation.

12. The method of claim 11 wherein the acts of transferring a first set of M*N data bits to a memory array in a first write operation and transferring a second set of M*N data bits to the memory array in a second write operation comprise transferring M*N bits to the memory array in parallel in each of the first and second write operations.

13. The method of claim 10 wherein the act of transferring data to or from N data bus terminals of the memory device in form of a burst of M bits of data to or from each terminal comprises:

sequentially transferring M bits to each of the N data bus terminals;

transferring a M*N data bits to a memory array in a write operation.

14. The method of claim 13 wherein the act of transferring M*N data bits to a memory array in a write operation comprises transferring M*N bits to the memory array in parallel in the write operation.

15. The method of claim 10 wherein the act of transferring data to or from 2N data bus terminals of the memory device in form of a burst of M bits of data to or from each terminal comprises:

coupling M serial data bits to each of the 2N data bus terminals;

converting the M serial data bits for each of the 2N data bus terminals to first and second sets of M/2 parallel data bits;

transferring the first set of M/2 parallel data bits to a memory array for each of the 2N data bus terminals; and transferring the second set of M/2 parallel data bits for each of the 2N data bus terminals to the memory array.

16. The method of claim 10 wherein the act of transferring data to or from N data bus terminals of the memory device in form of a burst of M bits of data to or from each terminal comprises:

coupling M serial data bits to each of the N data bus terminals;

converting the transferred M serial data bits to M parallel data bits for each of the N data bus terminals; and transferring the M parallel data bits for each of the N data bus terminals to a memory array.

* * * * *

UNITED STATES PATENT AND TRADEMARK OFFICE
CERTIFICATE OF CORRECTION

PATENT NO.        : 6,882,579 B2
APPLICATION NO. : 10/705388
DATED             : April 19, 2005
INVENTOR(S)       : Brent Keeth, Brian Johnson and Troy A. Manning It is certified that error appears in the above-identified patent and that said Letters Patent is hereby corrected as shown below:

| | Reads | Should Read |
|---|---|---|
| On the Title Page Item (57), Line 2 | "In either mode 32 bits" | --In either mode, 32 bits-- |
| Column 1, Line 62 | "or a low-speed," | --or as low-speed,-- |
| Column 3, Line 31 | "which the" | --with the-- |
| Column 3, Lines 44, 48, 49, 50, 52 and 53 | "complimentary" | --complementary-- |
| Column 3, Line 61 | "terminals coupled serial data" | --terminals couple serial data-- |
| Column 4, Line 3 | "54 FIG. 1) includes" | --54 (FIG. 1) includes-- |
| Column 4, Lines 4, 6, 23, 30 and 33 | "complimentary" | --complementary-- |
| Column 4, Line 50 | "flip-flips 120" | --flip-flops 120-- |
| Column 5, Line 9 | "coupled twice as many" | --couple twice as many-- |
| Column 5, Lines 39, 42 and 60 | "complimentary" | --complementary-- |
| Column 5, Line 45 | "It is for this reason, that this operating" | --It is for this reason that this operating-- |
| Column 6, Line 16 | "burst of 8 bits" | --bursts of 8 bits-- |
| Column 6, Line 34 | "150*a* RinPar signal" | --150*a* a RinPar signal-- |
| Column 6, Line 52 | "signal shift the" | --signal, shift the-- |
| Column 6, Line 61 | "compliment." | --complement.-- |

UNITED STATES PATENT AND TRADEMARK OFFICE
CERTIFICATE OF CORRECTION

PATENT NO. : 6,882,579 B2
APPLICATION NO. : 10/705388
DATED : April 19, 2005
INVENTOR(S) : Brent Keeth, Brian Johnson and Troy A. Manning It is certified that error appears in the above-identified patent and that said Letters Patent is hereby corrected as shown below:

| | | |
|---|---|---|
| Column 8, Line 55 | "data to or from 2N terminals of the memory device in form" | --data to or from 2N data bus terminals of the memory device in form-- |
| Column 9, Line 9 | "transferring a M*N data bits" | --transferring M*N data bits-- |
| Column 10, Line 19 | "transferring a M*N data bits" | --transferring M*N data bits-- |

Signed and Sealed this

Twenty-fourth Day of June, 2008

JON W. DUDAS
*Director of the United States Patent and Trademark Office*